(12) United States Patent
Hirano

(10) Patent No.: US 8,286,053 B2
(45) Date of Patent: Oct. 9, 2012

(54) METHOD AND APPARATUS FOR READING DATA

(75) Inventor: Takahito Hirano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1036 days.

(21) Appl. No.: 12/219,727

(22) Filed: Jul. 28, 2008

(65) Prior Publication Data

US 2008/0294961 A1 Nov. 27, 2008

Related U.S. Application Data

(63) Continuation of application No. PCT/JP2006/302532, filed on Feb. 14, 2006.

(51) Int. Cl.
*G06F 11/00* (2006.01)
(52) U.S. Cl. ......................... 714/763; 714/752
(58) Field of Classification Search .................. 714/763, 714/752, 753, 754, 758, 768
See application file for complete search history.

(56) References Cited

U.S. PATENT DOCUMENTS 4,654,847 A * 3/1987 Dutton ........................... 714/6.1
6,178,503 B1 * 1/2001 Madden et al. .................... 713/2
6,195,729 B1 * 2/2001 Arimilli et al. ................ 711/119
7,310,765 B1 * 12/2007 Feng et al. ..................... 714/763
7,822,965 B2 * 10/2010 Li et al. ............................ 713/2

FOREIGN PATENT DOCUMENTS

| JP | 6-324943 | 11/1994 |
|----|----------|---------|
| JP | 9-134314 | 5/1997 |
| JP | 11-96079 | 4/1999 |
| JP | 11-328015 | 11/1999 |

OTHER PUBLICATIONS

Japanese Office Action issued May 10, 2011 in corresponding Japanese Patent Application 2008-500362.
International Search Report mailed Mar. 20, 2006 in connection with the International Application No. PCT/JP2006/302532.

* cited by examiner

*Primary Examiner* — Dieu-Minh Le
(74) *Attorney, Agent, or Firm* — Staas & Halsey LLP

(57) ABSTRACT

A reading apparatus reads data from a storage device based on which an error correcting code is to be generated. An error determining unit reads the data from the storage device, and determines whether a read error has occurred in the data. A reading unit re-reads, when the error determining unit determines that a read error has occurred in the data, the same data from the storage device.

9 Claims, 8 Drawing Sheets

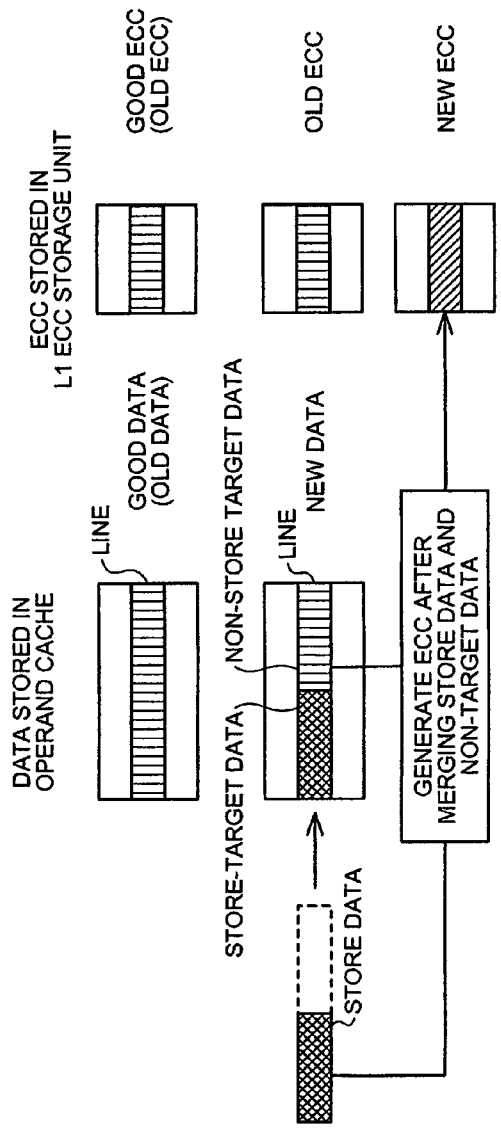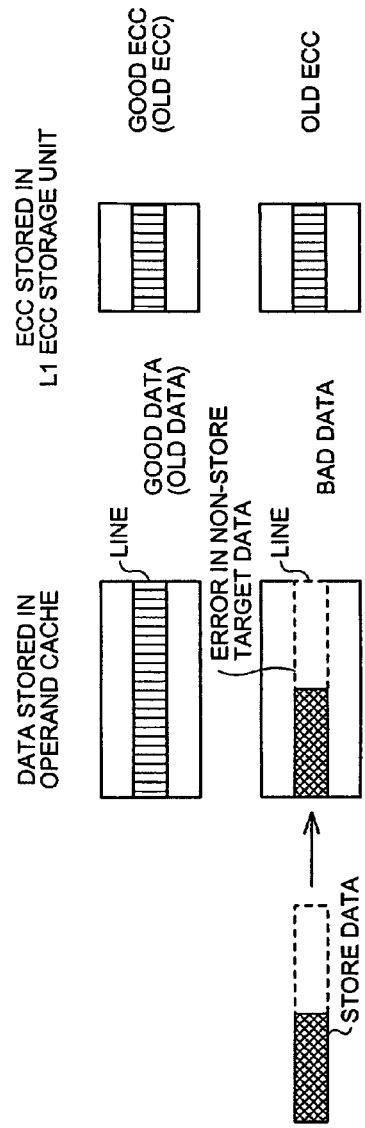
FIG.4A
FIG.4B

METHOD AND APPARATUS FOR READING DATA

This application is a continuation application filed under 35 U.S.C. 111(a) claiming the benefit under 35 U.S.C. 120 and 365(c) of a PCT International Application No. PCT/JP2006/302532 filed Feb. 14, 2006, in the Japanese Patent Office, the disclosure of which is hereby incorporated by reference.

BACKGROUND OF THE INVENTION

1. Field of the Invention

The present invention relates to a technology for reading data, based on which an error correcting code is to be generated, from a storage device.

2. Description of the Related Art

With the progress in the miniaturization in the field of semiconductor technologies, smaller storage elements are being used in random access memories (RAMs) of central processing units (CPUs). Such a small storage element, however, causes accidental inversion of data stored in the RAM. In an internal circuit of the RAM, a margin of a timing adjustment value is reduced to increase the operating frequency, which results in the RAM circuit being susceptible to fluctuation in voltage and temperature.

As a result, failure modes unanticipated heretofore occur. Failure modes include, for example, intermittent failure in the RAM cells due to alpha rays, resulting in damage to the data in the RAM, or intermittent write failure where the value of the RAM cells are not properly updated, or intermittent read failure caused by write recovery failure where the correct value is not read even if the correct value is stored in the RAM.

FIGS. 7 and 8 are schematic diagrams for explaining the write recovery failure in the RAM circuit. FIG. 7 is an example of the RAM circuit; and FIG. 8 is graphs of waveforms in the RAM circuit. The write recovery failure is a phenomenon in which if the data written to the RAM (for example, static RAM (SRAM)) is read immediately after it is written, the data remains in the bit line, which decreases the read margin of the next cycle. Write recovery failure occurs when, for example, the SRAM is operated at an operating cycle greater than the set value or when individual difference among the transistors is beyond what the designer anticipated.

To prevent the data from remaining in the bit line after being written, the SRAM circuit is designed in such a way that the bit line is shorted to source voltage Vdd within a specified time using precharged transistors (TrA, TrB, and TrC shown in FIG. 7). In other words, when writing the data, depending on the write data, the voltage of one bit line (the bit line represented by Bit in the waveform shown in FIG. 8) of the bit line pair (Bit and /Bit shown in FIG. 7) is lowered to a low level, and after writing is completed, the data is cleared away by shorting the bit line pair (Bit and /Bit) to the source voltage Vdd by the time the next read cycle starts.

However, if the precharged transistor is weak, the voltage at the bit line shows a dash-line waveform of a third graph from the top shown in FIG. 8. In other words, the voltage does not come up to the source voltage Vdd even after the next read cycle starts, leaving a difference in the potential in the bit lines. If reading starts in this state, the amplitude picked up by the original sense amplifier decreases, resulting in a read error or intermittent read failure.

Addressing the failure modes, Japanese Patent Application Laid-open No. H9-134314 discloses a mode in which the data stored in the RAM is directly transferred to an executing device (direct transfer mode) or after detecting and correcting error in the data (correction transfer mode). In other words, the data that needs to be quickly transferred to the computer device is transferred by the direct transfer mode and the data that does not need to be quickly transferred is transferred by the correction transfer mode, thus providing an effective solution to the failure modes occurring when reading from the RAM.

However, the conventional technology described above does not address the intermittent read failure caused by write recovery failure.

Intermittent read failure refers to read error occurring haphazardly even if correct data is stored in the RAM. Therefore, the same data read accurately the first time may fail to be read the second time.

If intermittent read failure occurs during storing operation in an operand cache of the CPU, even one-bit error is treated as uncorrectable error.

When the intermittent read failure is caused by write recovery failure, there is no use checking for error, far less correcting it, as the data stored in the RAM is correct in the first place.

SUMMARY

It is an object of the present invention to at least partially solve the problems in the conventional technology.

According to an aspect of the present invention, there is provided a reading apparatus. The reading apparatus includes an error determining unit that reads data from a storage device based on which an error correcting code is to be generated, and determines whether a read error has occurred in the data; and a reading unit that re-reads, when the error determining unit determines that a read error has occurred in the data, the same data from the storage device.

According to another aspect of the present invention, there is provided a reading method. The reading method includes determining including reading data from a storage device based on which an error correcting code is to be generated, and determining whether a read error has occurred in the data; and re-reading, when it is determined at the determining that a read error has occurred in the data, the same data from the storage device.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 4A and 4B are schematic diagrams for explaining the ECC generation process performed by the store merge process when there is a read error and there is no read error;

DETAILED DESCRIPTION OF THE PREFERRED EMBODIMENTS

Exemplary embodiments of the reading apparatus according to the present invention are described below with reference to accompanying drawings. Although the invention has been described with respect to a specific embodiment for a complete and clear disclosure, the appended claims are not to be thus limited.

The salient feature of the present invention is described first. If a read error occurs due to write recovery failure in a process of reading data from an operand cache (primary cache) of a CPU and generating an error correcting code (ECC) from the obtained data, data corresponding to error data that causes the read error is once again read from the operand cache.

Thus, one-bit uncorrectable error caused by intermittent read failure of the RAM is prevented from occurring by reading data corresponding to the error data that causes the read error from the operand again.

Further, since the read error caused by a write recovery failure is not because of any error in the data stored in the operand cache, correct data can be retrieved by merely reading the data once again from the operand cache, thus obviating the need for an error correction process.

Figure 1:
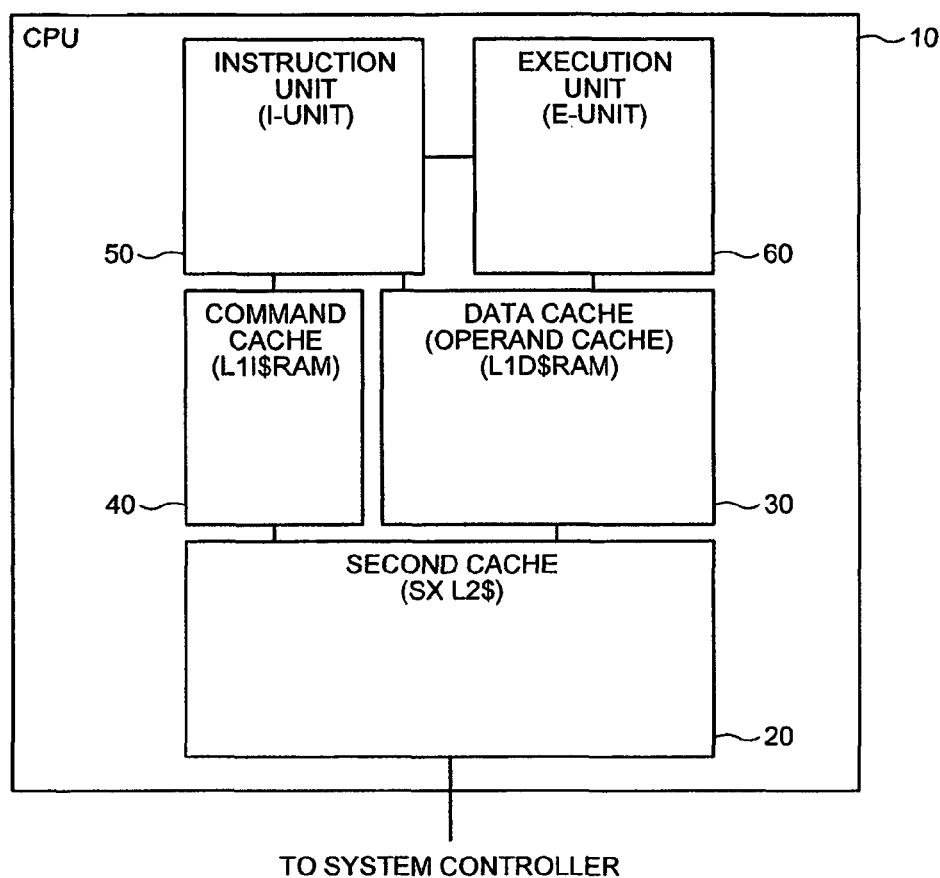
FIG. 1 is a block diagram of a typical CPU.

The structure of a typical CPU is described first. FIG. 1 is a block diagram of a CPU 10. The CPU 10 includes a second cache 20, an operand cache 30, a command cache 40, an instruction unit 50, and an execution unit 60. The CPU 10 is connected to a system controller (not shown) that controls the system.

The second cache 20 temporarily stores therein data received from the system controller and the operand cache 30. The operand cache 30 temporarily stores therein data received from the second cache 20, the instruction unit 50, and the execution unit 60.

The command cache 40 temporarily stores therein data received from the second cache 20 and stores therein command data required by the instruction unit 50. The instruction unit 50 retrieves the command data from the command cache 40, analyzes the retrieved command data, and sends an execute command corresponding to the analyzed command data to the execution unit 60. Upon receiving the execute command, the execution unit 60 reads data from the operand cache 30 according to the execute command, executes a calculation using the obtained data, and writes the resulting data to the operand cache 30.

Figure 2:
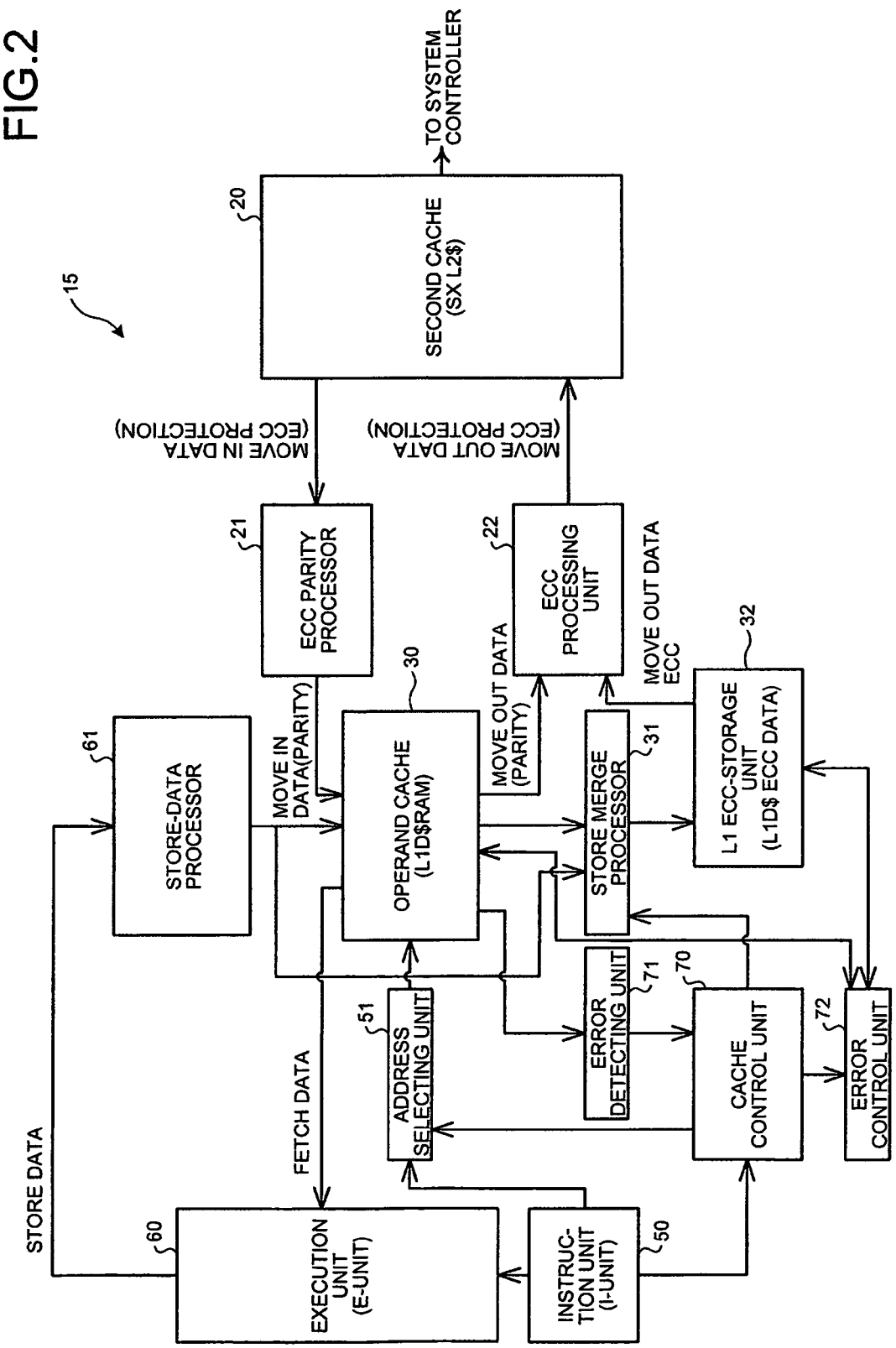
FIG. 2 is a block diagram of a CPU according to an embodiment of the present invention.

The structure of a CPU 15 according to an embodiment of the present invention is described below. FIG. 2 is a block diagram of the CPU 15. The CPU 15 includes the second cache 20, an ECC parity processor 21, an ECC processing unit 22, the operand cache 30, a store merge processor 31, an L1 ECC-storage unit 32, the instruction unit 50, an address selecting unit 51, the execution unit 60, a store-data processor 61, a cache control unit 70, an error detecting unit 71, and an error control unit 72.

The second cache 20 is similar to the second cache 20 shown in FIG. 1 and stores therein data received from the system controller. The second cache 20 also stores therein the data and the ECC corresponding to the data in a correlated form. Upon receiving a transfer command from a control unit (not shown), the second cache 20 transfers both the data and the ECC corresponding to the data to the ECC parity processor 21.

The ECC parity processor 21 receives the data and the ECC from the second cache 20, performs error check and error correction based on the ECC, creates a parity of the data, and transfers the data and the created parity attached thereto to the operand cache 30.

The ECC processing unit 22 acquires the data from the operand cache 30 and the ECC from the L1 ECC-storage unit 32, performs error check and error correction based on the ECC, and transfers the data after error check and error correction to the second cache 20. The L1 ECC-storage unit 32 stores therein the ECC corresponding to the data stored in the operand cache 30.

The operand cache 30 stores therein the data received from the second cache 20. The operand cache 30 stores therein data in predetermined areas called data lines. Data on all of or part of the data lines is updated by the store data processor 61. The data that is to be updated by the store data processor 61 is called "store target data".

The store-data processor 61 retrieves data indicative of a result of calculation performed by the execution unit 60 (hereinafter, "store data") from the execution unit 60, and updates the store-target data stored in the operand cache 30 using the store data. Similar to the execution unit 60 shown in FIG. 1, the execution unit 60 shown in FIG. 2 executes calculation in response to the execute command received from the instruction unit 50. The execution unit 60 then sends the store data to the store-data processor 61.

The instruction unit 50 has a similar function as that shown in FIG. 1, and retrieves and analyzes data from the command cache 40, and sends various commands to the address selecting unit 51, the cache control unit 70, and the execution unit 60.

The store merge processor 31 generates the ECC corresponding to the data that is stored in the operand cache 30, and stores the generated ECC in the L1 ECC-storage unit 32. If the store-data processor 61 is updating a part of store target data on a given line of the operand cache 30 using the store data, the store merge processor 31 retrieves the store data from the store-data processor 61 and data other than the store target data on the given line (hereinafter, "non-store target data") from the operand cache 30. The store merge processor 31 merges the store data and the non-store target data, generates the ECC based on the merged data, and stores the ECC in the L1 ECC-storage unit 32.

Upon receiving a re-read request from the cache control unit 70, the store merge processor 31 discards the ECC, reads the data from the concerned line in the operand cache 30, generates the new ECC, and stores the new ECC in the L1 ECC-storage unit 32. As the store-target data is already updated by the store-data processor 61, when re-reading the data, the store merge processor 31 does not perform data merging but simply reads the data (i.e., the store data and the non-store target data) from the concerned line, and generates the new ECC.

Upon receiving a notification of a read error from the error detecting unit 71, the cache control unit 70 sends a re-read request to the store merge processor 31. When the store merge processor 31 generates the ECC, the error detecting unit 71 determines whether a read error occurs in the data the store merge processor 31 has read from the operand cache 30. If a read error has occurred, the error detecting unit 71 notifies the cache control unit 70 of the read error. The error control unit 72 processes the error that occurs during cache control.

The address selecting unit 51 selects the address of the data stored in the operand cache 30 based on the command from the instruction unit 50 or the cache control unit 70. For example, when the instruction unit 50 interprets the command based on the data stored in the command cache and instructs the execution unit 60 to execute the command, the instruction unit 50 sends a command to the address selecting unit 51 to select the address of the execution target data. The execution unit 60 reads the data corresponding to the address selected by the address selecting unit 51.

When the cache control unit 70 receives a read error notification from the error detecting unit 71, the instruction unit 50 sends a command to the address selecting unit 51 to select the address of the line containing the data that causes the read error was encountered, so that the store merge processor 31 re-reads the data stored in the operand cache 30. By re-reading the data in the address selected by the address selecting unit 51, the store merge processor 31 is able to read the data free of error caused by write recovery failure, and generate the appropriate ECC.

Figure 3:
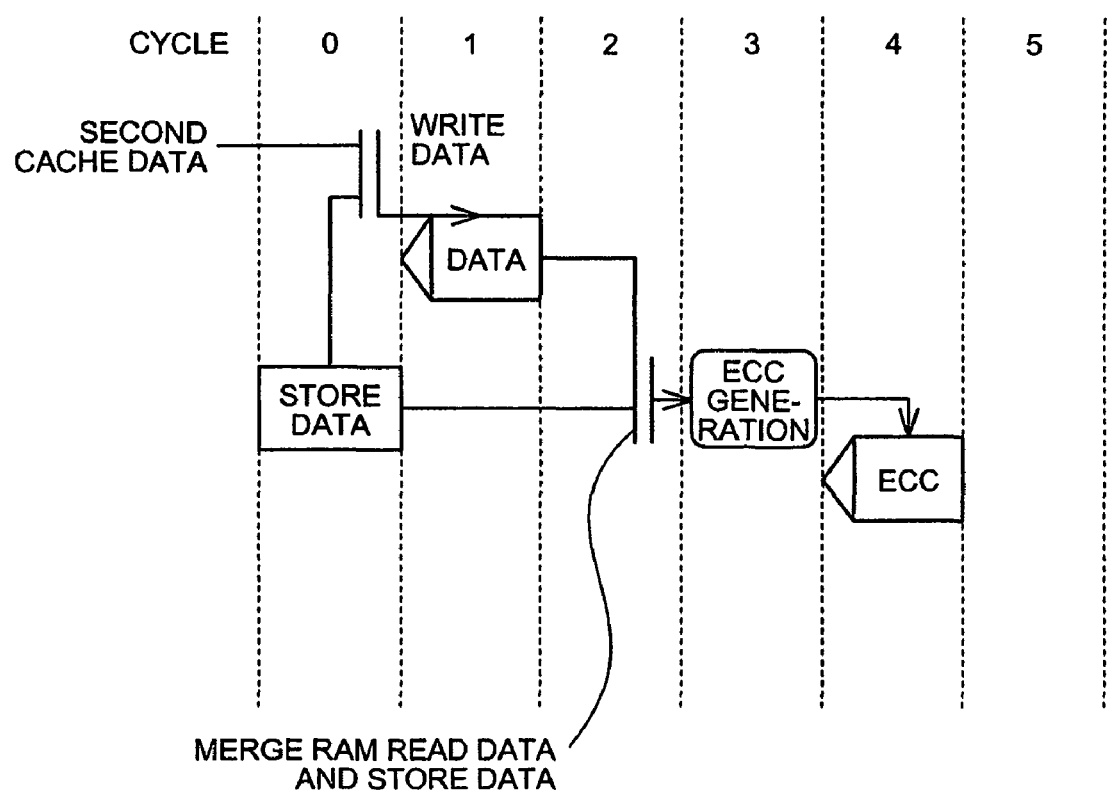
FIG. 3 is a schematic diagram for explaining an ECC generation process performed by a store merge processor shown in FIG. 2.

An ECC generation process performed by the store merge processor 31 is described below. FIG. 3 is a schematic diagram for explaining the ECC generation process performed by the store merge processor 31. It is supposed in the example shown in FIG. 3 that there is no read error when reading the data from the operand cache 30.

In cycle 0, the order of priority for the data transferred from the second cache 20 and the store data is determined. If the data transferred from the second cache 20 takes precedence over the store data, the data from the second cache 20 is written to the operand cache 30 in cycle 1, the store merge processor 31 generates the ECC for the transferred data in cycle 3, and stores the ECC in the L1 ECC-storage unit 32 in cycle 4.

On the other hand, if in cycle 0, the store data takes precedence over the data transferred from the second cache 20, the store-data processor 61 stores the store data in the operand cache 30 in cycle 1, the store merge processor 31 merges the store data and the data other than store data in cycle 2, generates the ECC for the merged data in cycle 3, stores the ECC in the L1 ECC-storage unit 32 in cycle 4.

FIG. 4A is a schematic diagram for explaining the ECC generation process performed by the store merge processor 31 when a read error occurs; and FIG. 4B is a schematic diagram for explaining the ECC generation process performed by the store merge processor 31 when no read error occurs.

The ECC generation process when no read error occurs is described first. As shown in FIG. 4A, the line in the operand cache 30 contains error-checked (i.e., error-free) data and the ECC corresponding to this data is stored in the L1 ECC-storage unit 32.

When the storing process in the operand cache 30 is commenced, the store merge processor 31 retrieves the store data from the store-data processor 61, reads the non-store target data from the operand cache 30, merges the store data and the non-store target data, generates a new ECC, and stores the ECC in the L1 ECC-storage unit 32.

The ECC generation process when a read error occurs due to write recovery failure is described below. As shown in FIG. 4B, the line in the operand cache 30 contains error-checked data, and the ECC corresponding to the data is stored in the L1 ECC-storage unit 32.

When the storing process in the operand cache 30 is commenced, the store merge processor 31 retrieves the store data from the store-data processor 61 and reads the non-store target data from the operand cache 30. If the error detecting unit 71 detects that a read error occurs when reading the data from the operand cache 30, the cache control unit 70 sends a request to re-read the concerned line, and the store merge processor 31 re-reads the data contained in the concerned line from the operand cache 30, generates the ECC, and stores the ECC in the L1 ECC-storage unit 32.

If re-reading the data from the operand cache 30, the store merge processor 31 generates the ECC based on the obtained data without merging the store data and the non-store target data. This is because the store merge processor 31 reads data that has been already updated by the operand cache 30.

Figure 5:
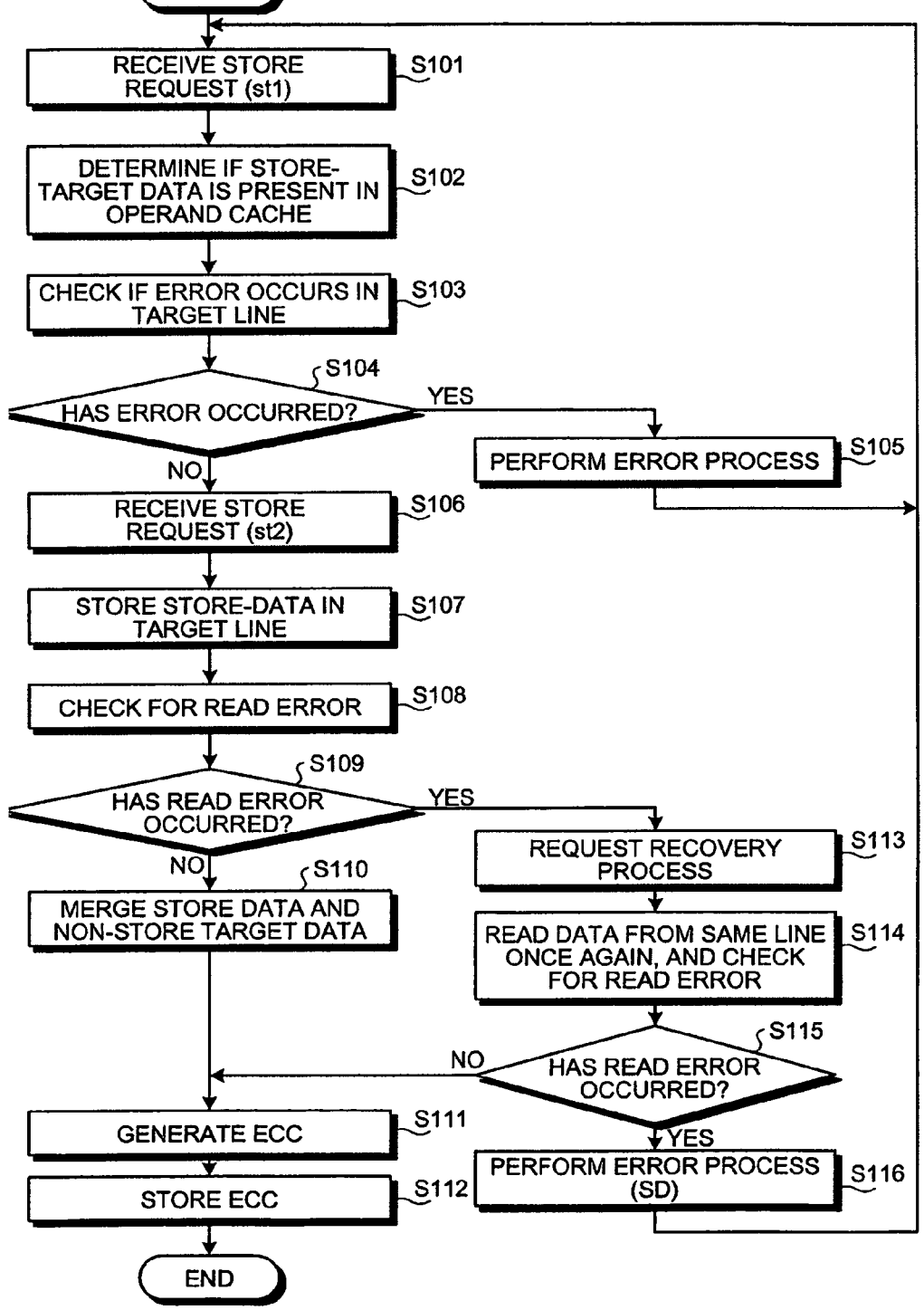
FIG. 5 is a flowchart of an update process of store-target data of an operand cache.

An update process of updating the store-target data of the operand cache 30 is described below. FIG. 5 is a flowchart of the update process. The cache control unit 70 receives a store request (st1) from the instruction unit 50 (Step S101). The error control unit 72 checks whether the store-target data is present in the operand cache 30 (Step S102).

If the store-target data is present in the operand cache 30, the cache control unit 70 checks whether any error occurs in the target line (Step S103).

If an error occurs in the target line (Yes at Step S104), the error control unit 72 performs an error process (Step S105), an error recovery process, and returning to Step S101, sends the store request again. If no error occurs in the target line (No at Step S104), the cache control unit 70 receives a store request (st2) from the instruction unit 50 (Step S106), and the store-data processor 61 stores the store data in the target line (Step S107).

The error detecting unit 71 checks whether any read error has occurred in the data read from the operand cache 30 (Step S108). If no read error has occurred (No at Step S109), the store merge processor 31 merges the store data and the non-store target data (Step S110), generates the ECC (Step S111), and stores the ECC in the L1 ECC-storage unit 32 (Step S112).

If a read error has occurred (Yes at Step S109), the cache control unit 70 requests the store merge processor 31 to perform a recovery process (i.e., re-reading, Step S113).

The store merge processor 31 re-reads the data from the same line, and the error detecting unit 71 checks whether any read error has occurred in the data re-read by the store merge processor 31 (Step S114).

If no read error has occurred (No at Step S115), the process proceeds to Step S111. If a read error has occurred (Yes at Step S115), the cache control unit 70 performs the error process (Step S116). At Step S116, a flag indicating that the error is uncorrectable is affixed, and the process returns to Step S101.

Thus, by re-reading the data once again from the operand cache 30 in response to the command from the cache control unit 70, the read error caused by write recovery failure can be effectively prevented.

Figure 6:
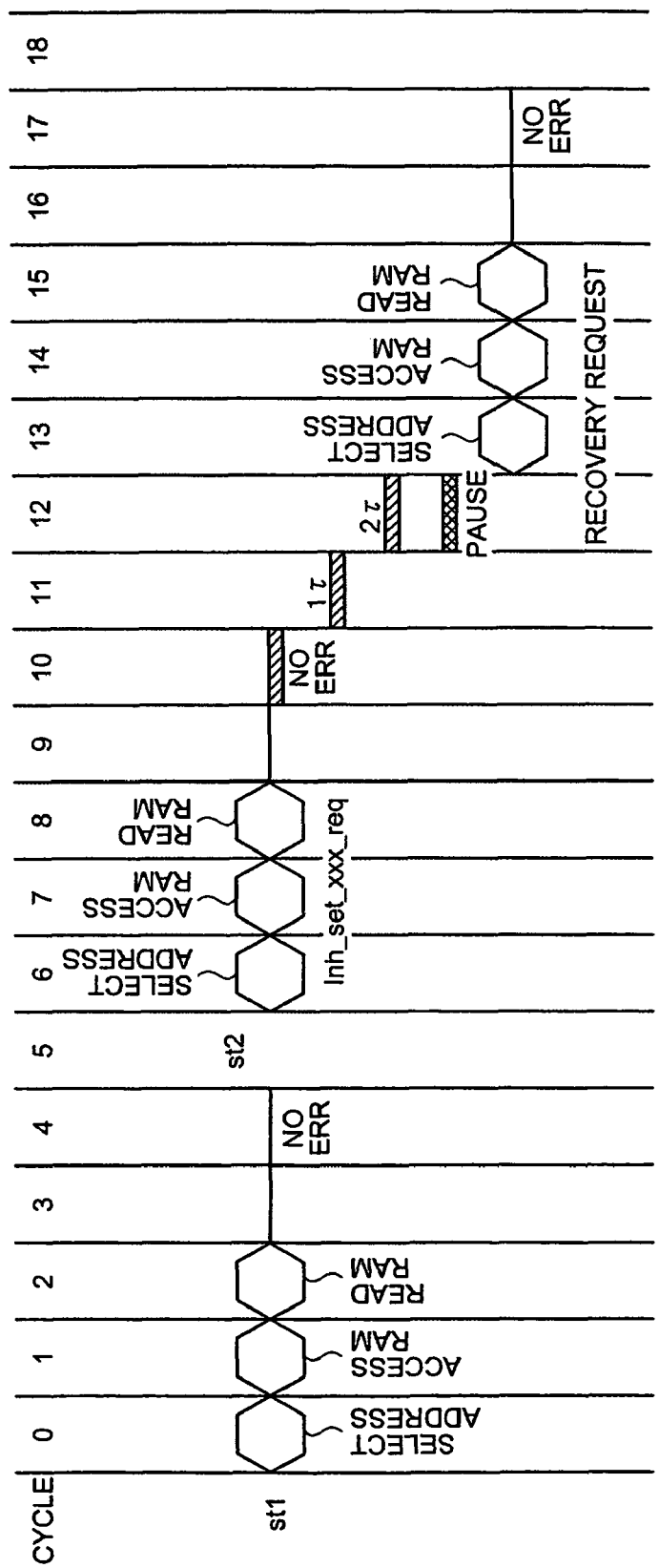
FIG. 6 is a time chart of a read error recovery flow.
Figure 7:
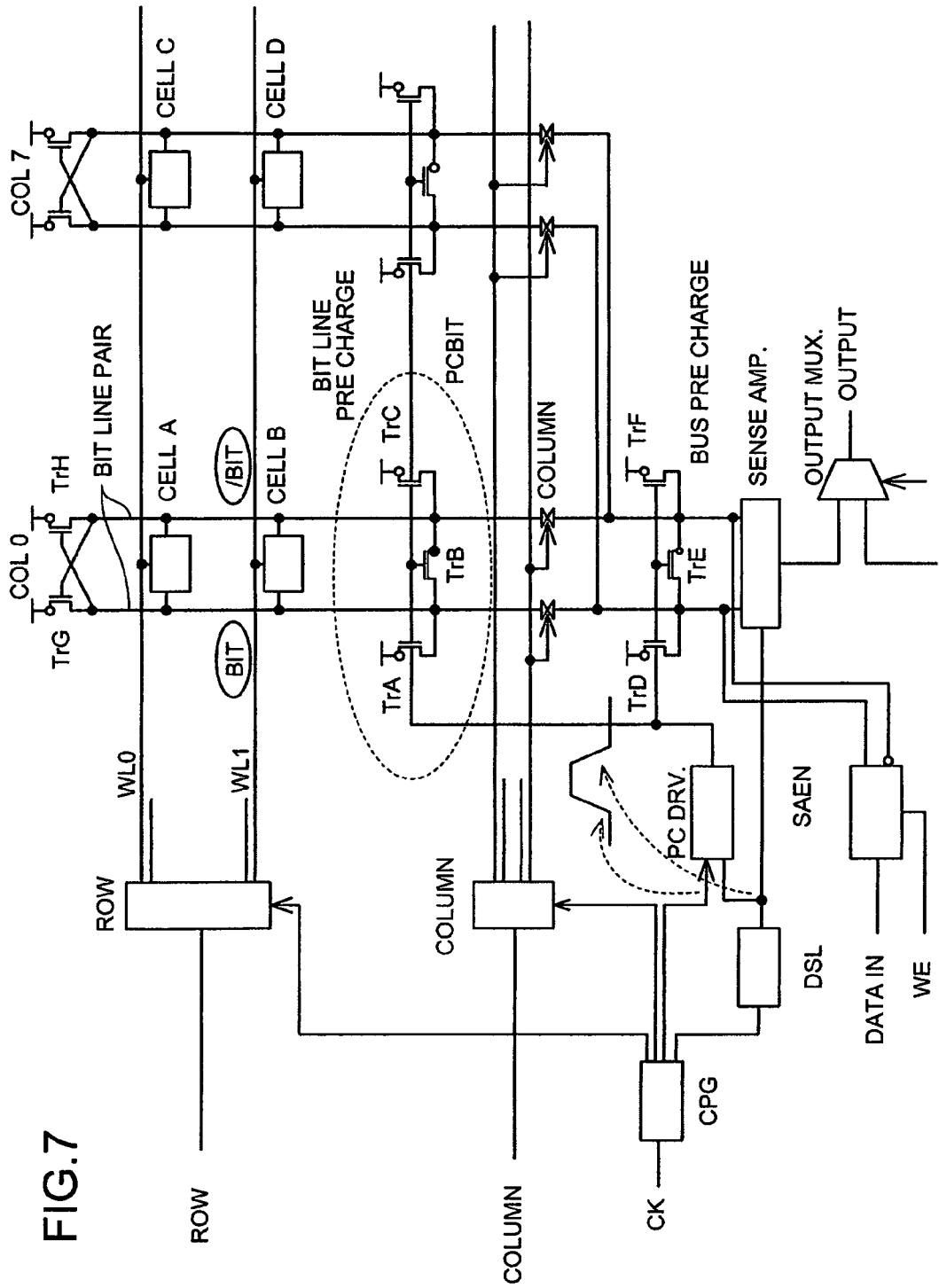
FIG. 7 is an example of a RAM circuit for explaining a write recovery failure in the RAM circuit.
Figure 8:
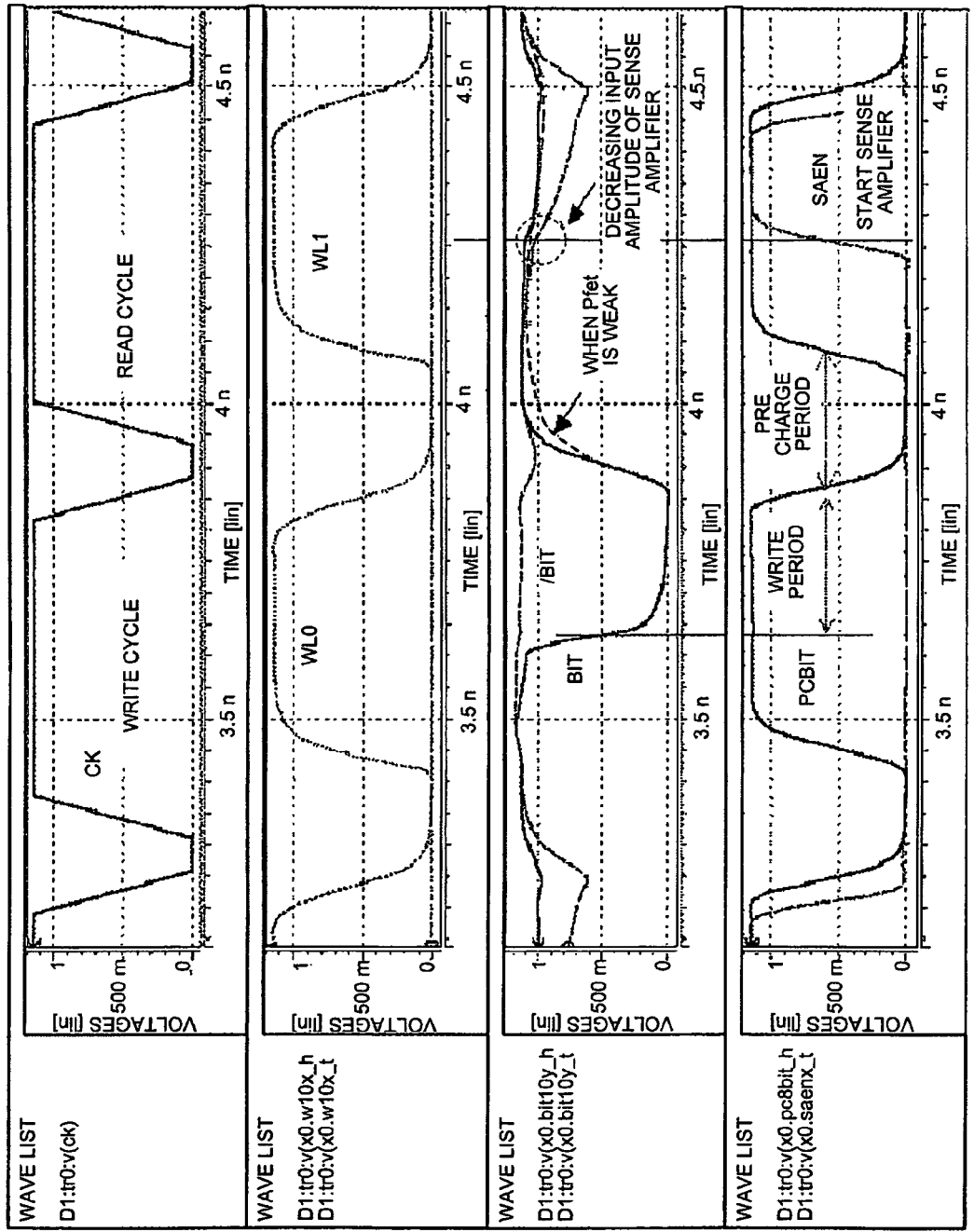
FIG. 8 is graphs of waveforms in the RAM circuit shown in FIG. 7.

A time chart of a read-error recovery flow is described below. FIG. 6 is a time chart of a read-error recovery flow. As shown in FIG. 6, the error detecting unit 71 checks for errors of the target line from cycle 0 to cycle 4 (storage process st1).

If no error is detected in the storage process st1, the error detecting unit 71 performs storage process st2 from cycle 5 to cycle 10. The error detecting unit 71 determines whether any read error has occurred in cycle 10 of the storage process st2.

If it is determined in cycle 10 that a read error has occurred, the error detecting unit 71 outputs the command 'st2_read_pe' to the cache control unit 70. Upon receiving 1τ of 'st2_read_pe', the cache control unit 70 issues the command 'inh_set_xxx_req' and prevents any other request to be processed in cycle 12. In cycle 12, the cache control unit 70 receives 2τ of 'st_read_pe', issues the command 'inh- _set_xxx_req', and stops all requests other than those to be purged from being processed in cycle 13. Thus, read error caused by write recovery failure is prevented by incorporating a pause in cycle 12 wherein writing to the RAM is prevented by the command 'inh_set_xxx-req'.

The cache control unit 70 requests the address selecting unit 51 to select the address of the line (in which read error has occurred) in the operation cache in cycle 15, two cycles after the cycle in which read error occurs. The store merge processor 31 generates the ECC in cycle 16, and stores the ECC in the L1 ECC-storage unit 32.

Thus, according to the present embodiment, in the ECC generation process, when store-target data is read from the operand cache 30, the error detecting unit 71 checks for read errors in the store-target data, and if a read error occurs, the store merge process reads the data from the line in the operand cache 30 again, and generates the ECC. Consequently, one-bit uncorrectable error caused by intermittent read failure of the RAM is prevented from occurring by reading data corresponding to the data that causes the read error from the operand cache 30 again.

Moreover, since the read error caused by a write recovery failure is not because of any error in the data stored in the operand cache, correct data can be retrieved by merely reading the data again from the operand cache, thus obviating the need for an error correction process.

According to an embodiment of the present invention, one-bit error caused by intermittent read failure of a RAM is prevented from developing into an uncorrectable error.

Moreover, a read error caused by write recovery failure is not because of any error in the data stored in an operand cache. Consequently, correct data can be retrieved by merely reading the data once again from the operand cache, thus obviating the need for an error correction process.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

The invention claimed is:

1. A reading apparatus comprising:
an error determining unit that reads second data from a storage device based on which an error correcting code is to be generated, and determines whether a read error has occurred in the second data when a first area of the storage device includes first data and the second data, and the first data is updated while the second data is not updated;
a reading unit that re-reads, when the error determining unit determines that a read error has occurred in the second data, the second data from the storage device; and
a correcting-code generating unit that generates the error correcting code based on the first data and the second data that is re-read by the reading unit.

2. The reading apparatus according to claim 1, wherein the error correcting code is used to correct error data that is transferred from a primary cache of a central processing unit to a secondary cache of the central processing unit.

3. The reading apparatus according to claim 1, further comprising a correcting unit that corrects an error in third data stored in the storage device based on the error correcting code,
wherein the error determining unit, upon receiving a request to read the third data that is corrected by the correcting unit, reads the third data from the storage device, and determines whether a read error has occurred in the third data.

4. The reading apparatus according to claim 1, wherein the first data is related to a result of computation performed by an executing unit.

5. The reading apparatus according to claim 1, wherein when the error determining unit determines that a read error has occurred, the reading unit re-reads the second data from the storage device after elapse of a predetermined time.

6. A reading method, comprising:
reading second data from a storage device based on which an error correcting code is to be generated when a first area of the storage device includes first data and the second data, and the first data is updated while the second data is not updated;
determining whether a read error has occurred in the second data;
re-reading, when the determining indicates that a read error has occurred in the second data, the second data from the storage device; and
generating the error correcting code based on the first data and the second data that is re-read at the re-reading.

7. The reading method according to claim 6, wherein the error correcting code is used to correct error data that is transferred from a primary cache of a central processing unit to a secondary cache of the central processing unit.

8. The reading method according to claim 6, further comprising correcting an error in third data stored in the storage device based on the error correcting code, wherein
the determining including, upon receiving a request to read the third data that is corrected at the correcting, reading the third data from the storage device, and determining whether a read error has occurred in the third data.

9. The reading method according to claim 8, wherein the first data is related to a result of computation performed by an executing unit.

* * * * *

UNITED STATES PATENT AND TRADEMARK OFFICE
CERTIFICATE OF CORRECTION

| | | |
|---|---|---|
| PATENT NO. | : 8,286,053 B2 | Page 1 of 1 |
| APPLICATION NO. | : 12/219727 | |
| DATED | : October 9, 2012 | |
| INVENTOR(S) | : Takahito Hirano | |

It is certified that error appears in the above-identified patent and that said Letters Patent is hereby corrected as shown below:

In the Claims:

Column 7, Line 42, In Claim 1, delete "apparatus" and insert -- apparatus, --, therefor.

Column 8, Line 48, In Claim 9, delete "claim 8," and insert -- claim 6, --, therefor.

Signed and Sealed this
Thirteenth Day of August, 2013

Teresa Stanek Rea
*Acting Director of the United States Patent and Trademark Office*